United States Patent [19]

McKenna

[11] Patent Number: 5,570,987
[45] Date of Patent: Nov. 5, 1996

[54] SEMICONDUCTOR WAFER TRANSPORT CONTAINER

[75] Inventor: Douglas B. McKenna, Wilmington, Del.

[73] Assignee: W. L. Gore & Associates, Inc., Newark, Del.

[21] Appl. No.: 166,589

[22] Filed: Dec. 14, 1993

[51] Int. Cl.[6] ................................................. B65D 85/00
[52] U.S. Cl. ........................................... 414/416; 414/940
[58] Field of Search .................................. 414/217, 292, 414/331, 416, 940; 220/503–4, 524, 601, 661, 315

[56] References Cited

U.S. PATENT DOCUMENTS

| | | |
|---|---|---|
| Re. 34,311 | 7/1993 | Millis et al. . |
| 4,431,361 | 2/1984 | Bayne . |
| 4,520,925 | 6/1985 | Johnson . |
| 4,532,970 | 8/1985 | Tullis et al. . |
| 4,534,389 | 8/1985 | Tullis . |
| 4,540,326 | 9/1985 | Southworth et al. . |
| 4,557,957 | 12/1985 | Manniso . |
| 4,582,219 | 4/1986 | Mortensen et al. . |
| 4,636,128 | 1/1987 | Millis et al. ........................... 414/217 |
| 4,660,464 | 4/1987 | Tanaka . |
| 4,667,579 | 5/1987 | Daw . |
| 4,668,484 | 5/1987 | Elliot . |
| 4,674,936 | 6/1987 | Bonora . |
| 4,674,939 | 6/1987 | Maney et al. . |
| 4,676,144 | 6/1987 | Smith, III . |
| 4,676,709 | 6/1987 | Bonora et al. . |
| 4,684,021 | 8/1987 | Niebeling . |
| 4,687,542 | 8/1987 | Davis et al. ........................ 414/416 X |
| 4,705,444 | 11/1987 | Tullis et al. . |
| 4,709,834 | 12/1987 | Mortensen et al. . |
| 4,739,882 | 4/1988 | Parikh et al. . |
| 4,744,715 | 5/1988 | Kawabata ............................ 414/416 X |
| 4,746,256 | 5/1988 | Boyle et al. ......................... 414/331 X |
| 4,770,680 | 9/1988 | Machida et al. . |
| 4,802,809 | 2/1989 | Bonora et al. . |
| 4,804,086 | 2/1989 | Grohrock ............................ 414/940 X |
| 4,815,912 | 3/1989 | Maney et al. ............................ 414/217 |
| 4,859,137 | 8/1989 | Bonora et al. . |
| 4,867,629 | 9/1989 | Iwasawa et al. ........................ 414/331 |
| 4,900,214 | 2/1990 | Ben . |
| 4,923,353 | 5/1990 | Tullis et al. . |
| 4,934,767 | 6/1990 | Hoyt, III et al. . |
| 4,963,069 | 10/1990 | Wurst et al. ........................... 414/416 |
| 4,986,715 | 1/1991 | Asakawa . |
| 5,024,329 | 6/1991 | Grohrock . |
| 5,056,875 | 10/1991 | Akins .................................. 414/217 X |
| 5,059,079 | 10/1991 | Foulke et al. . |
| 5,139,459 | 8/1992 | Takahashi et al. .................. 414/217 X |
| 5,181,819 | 1/1993 | Sakata et al. . |
| 5,226,781 | 7/1993 | Glachet et al. ...................... 414/292 X |
| 5,340,261 | 8/1994 | Oosawa et al. ........................ 414/217 |
| 5,364,219 | 11/1994 | Takahashi et al. ..................... 414/217 |
| 5,378,107 | 1/1995 | Vierny et al. ....................... 414/940 X |
| 5,387,067 | 2/1995 | Grunes .................................. 414/217 |
| 5,388,944 | 2/1995 | Takanabe et al. ...................... 414/217 |
| 5,404,894 | 4/1995 | Shiraiwa ............................. 414/217 X |
| 5,445,491 | 8/1995 | Nakagawa et al. .................. 414/217 X |

FOREIGN PATENT DOCUMENTS

| | | |
|---|---|---|
| 0138473 | 4/1985 | European Pat. Off. . |
| 0267507 | 5/1988 | European Pat. Off. . |
| 3284541 | 12/1991 | Japan .................................... 414/217 |
| 8809563 | 12/1988 | WIPO . |

OTHER PUBLICATIONS

Literature: "Carry Out Rapid Transfers With Complete Safety"; SNE la Calhene; Date: May 1988.

Literature: "A Technology for Wafer Cassette Transfer in VLSI Manufacturing" Solid State Technology; vol. 27 No. 7, Jul. 1984, Washington, US pp. 111–115.

*Primary Examiner*—James W. Keenan
*Attorney, Agent, or Firm*—David J. Johns; Carol A. Lewis White

[57] ABSTRACT

An improved clean environment container for semiconductor wafers that can have more than one port for interfacing with a clean environment. The multiple ports permit interfacing with more than one type of clean environment interface. A diagonal seal surface provides a tight clean seal around the container door and the interface between the door and the clean environment, maintaining utmost cleanliness.

4 Claims, 8 Drawing Sheets

SEMICONDUCTOR WAFER TRANSPORT CONTAINER

BACKGROUND OF THE INVENTION

The invention relates to containers for handling semiconductor wafers, and more particularly to containers for transporting and storing wafer carriers while maintaining a clean environment.

The manufacturing of integrated circuits (ICs) requires an extremely clean environment. ICs are typically manufactured on thin slices of semiconductor materials, such as silicon, called wafers. The fine circuit patterns are fabricated onto the wafer through a sequence of many process steps. These steps are very sensitive to particulate contamination as even very small particles of dust can interfere with the fabrication process and cause defects in the IC. Since particle related defects directly impact the costs of production, increasing the cleanliness of the manufacturing environment has achieved increased productivity by producing higher yields of ICs.

Each process step is performed in sequence by a particular piece of equipment or tool. The wafers are normally transported between tools in carriers (cassettes) that hold many wafers, typically 25, in parallel slots. Thus, upon completion of one process, the cassette of wafers is transported to the next tool for further processing.

The conventional clean room is one method for providing a clean manufacturing environment. Special equipment circulates filtered air throughout the entire room housing all process tools. Personnel working in the room wear special clothing to reduce the particle contamination from themselves. The wafers are processed and transported between tools without leaving the clean room environment. The disadvantages of clean rooms, however, are many. These special rooms are expensive to construct and maintain, and typically encompass very large areas making it difficult to maintain utmost cleanliness. Furthermore, even though specially clothed, the personnel working within the clean rooms are a constant source of particle contamination.

A major improvement over the clean room is the Standard Mechanical Interface (SMIF) system which incorporates the concept of clean mini-environments. Details of a SMIF system are described in the article "SMIF: A TECHNOLOGY FOR WAFER CASSETTE TRANSFER IN VLSI MANUFACTURING", by Mihir Parikh and Ulrich Kaempf, *Solid State Technology*, July 1984, pp. 111–115. Each tool or piece of equipment is enclosed within its own small clean environment. Once inside the clean environment of a particular tool, wafers can be manipulated by automated equipment or by personnel using sterile glove ports to reach within. It has been found that such small mini-environments of particle free air having no internal source of particulates provides the cleanest possible environment for manufacturing wafers. Moreover, since the cleanliness of the mini-environment is independent of the external environment, IC manufacturing can proceed in a non-clean facility. The expense and inconvenience of a large clean room is eliminated and process yields of ICs are improved due to the lower concentration of particulate contamination.

A SMIF system comprises three main components:

(1) A small clean environment surrounding the wafer handling mechanism of each process tool. This is typically provided by a canopy over the tool or port through which the cassette of wafers passes into the tool. The canopy isolates the internal environment of the tool from the outside, creating a clean environment for wafer processing.

(2) A small contamination free container or pod (SMIF box) for transporting and or storing a cassette of wafers. The pod maintains a clean environment within.

(3) A mechanical interface whereby the door on the container is designed to mate with the access door of an interface port on the equipment canopy such that the two doors can be opened simultaneously and moved as a unit into the clean interior space, trapping any particles on the external door surfaces between the doors. A particle free interface is thus created whereby the cassette can be transferred between the container and canopy while maintaining a clean environment in both.

In a SMIF system, the container is placed on top of the interface port located on a top area of the tool canopy. Latches release the bottom door on the container and the canopy port access door simultaneously. Because the outside of the container door mates with the outside of the canopy interface port door, most of the particles on the outside of the door are trapped between the two doors. A mechanical elevator lowers the two mated doors, with the cassette riding on top of the doors, into the canopy enclosed mini-environment of the tool. A manual or automated manipulator picks up the cassette and positions it for processing. After processing, the reverse operation takes place, placing the cassette back into the pod for transport to the next tool or for storage.

Semiconductor Equipment and Materials International (SEMI), a consortium of IC manufacturers, has promulgated standards (hereinafter referred to as the Semi-Standards) for the interface port and container door of the SMIF system. The Semi-Standards provide a uniform industry standard so that containers and tool canopy interfaces of different manufacturers can be compatible. One such standard is SEMI E19, 4-92, 200MM "STANDARD MECHANICAL INTERFACE (SMIF)" published in 1992.

While the present SMIF system has proved effective in providing extremely clean environments for fabricating ICs, improvements to the container are needed to increase the system's utility and cleanliness. Present SMIF containers have a lower door designed for a specific interface system such as the Semi-Standard. The interface of each and every clean environment or tool canopy in a particular manufacturing line must be compatible with this one interface so that the wafers can be transported from tool to tool for processing. Installation of an improved or different interface would require the changing of all tool interfaces to maintain compatibility. The prohibitive costs of changing all clean environments simultaneously to a new interface has restricted the development of improved interface systems.

Additionally, the bottom door container has inherent ergonomic problems. Since the cassette is lowered into the clean environment through the bottom door, the container must interface a top area of the clean environment. Personnel transport the containers between tools, constantly lifting the containers to the top of the canopies. Although 6 inch diameter wafers are presently used, the industry is presently switching to heavier 8 inch wafers to increase the number of ICs fabricated on a single wafer. A cassette of 8 inch wafers is much heavier than the 6 inch wafers and much more difficult to handle. One solution proposes an extension or addition of the clean environment canopy having a lower top portion. Once the cassette is lowered within, a robot device raises the cassette to the elevation necessary for the process tool. Such robots, however, are expensive to purchase and maintain. Another solution is an automated device located outside the clean environment canopy which raises the pod from a lower height to the interface port on top of the canopy. This too, however, is expensive to manufacture and maintain.

It is also believed desirable to provide an improved interface seal between the container and the clean environment. Improvements over present interfaces will permit a cleaner manufacturing environment and increased IC yields.

In light of the foregoing, it is a primary object of the present invention to create a container capable of interfacing with more than one particular interface design.

It is a further object of the present invention to provide a container capable of interfacing with the side of a clean environment.

Another object of the present invention is to provide an improved interface system which maintains a cleaner manufacturing environment.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

The present invention provides a unique clean environment container which can mate with more than one specific interface system, and which maintains a cleaner environment within.

One embodiment of the invention provides a container having a housing and multiple openings in the housing. A first door unit seals the first opening and is adapted to interface with a first access port on a clean environment. One or more door units seals the other openings and each is adapted to interface with different access ports on clean environments. The result is a container compatible with more than one type of interface system in a particular IC manufacturing facility.

Another embodiment provides a container having a lower opening and one or more side openings in the housing. A first door unit seals the lower opening and is adapted to interface with a first access port on a clean environment. At least one side door unit seals the side opening and is adapted to interface with other interfaces on a clean environment. The result is a container that is easier to use since the side door or doors permits interfacing to clean environments at lower heights.

A further embodiment of the present invention provides a container having an improved seal. Cleanliness within the container is improved with a diagonal seal surface for sealing the door unit to the housing when the door is closed, and which is adapted to interface with a complementary seal face on a clean environment. Since cleanliness directly affects the manufacturing process, IC yields can be increased.

The present invention provides an improved pod which is far more versatile than any presently available units. The pods of the present invention allow for interface with a number of different clean environment ports and the free exchange of wafer cassettes between such ports. This versatility allows for ease in transfer, reduced costs in changes between interface types and far more flexibility in the movement of cassettes.

BRIEF DESCRIPTION OF THE DRAWINGS

The foregoing summary, as well as the following detailed description will be better understood when read in conjunction with the figures appended hereto. For the purpose of illustrating the invention, there is shown in the drawings several embodiments. It is understood, however, that this invention is not limited to the precise arrangement and instrumentalities shown.

DETAILED DESCRIPTION

The present invention comprises multiple door pod containers for transporting high purity items between clean environments. As used herein, the term "clean environment" is intended to include any contained area having elevated purity levels, including clean rooms, mini environments, etc.

Figure 1:
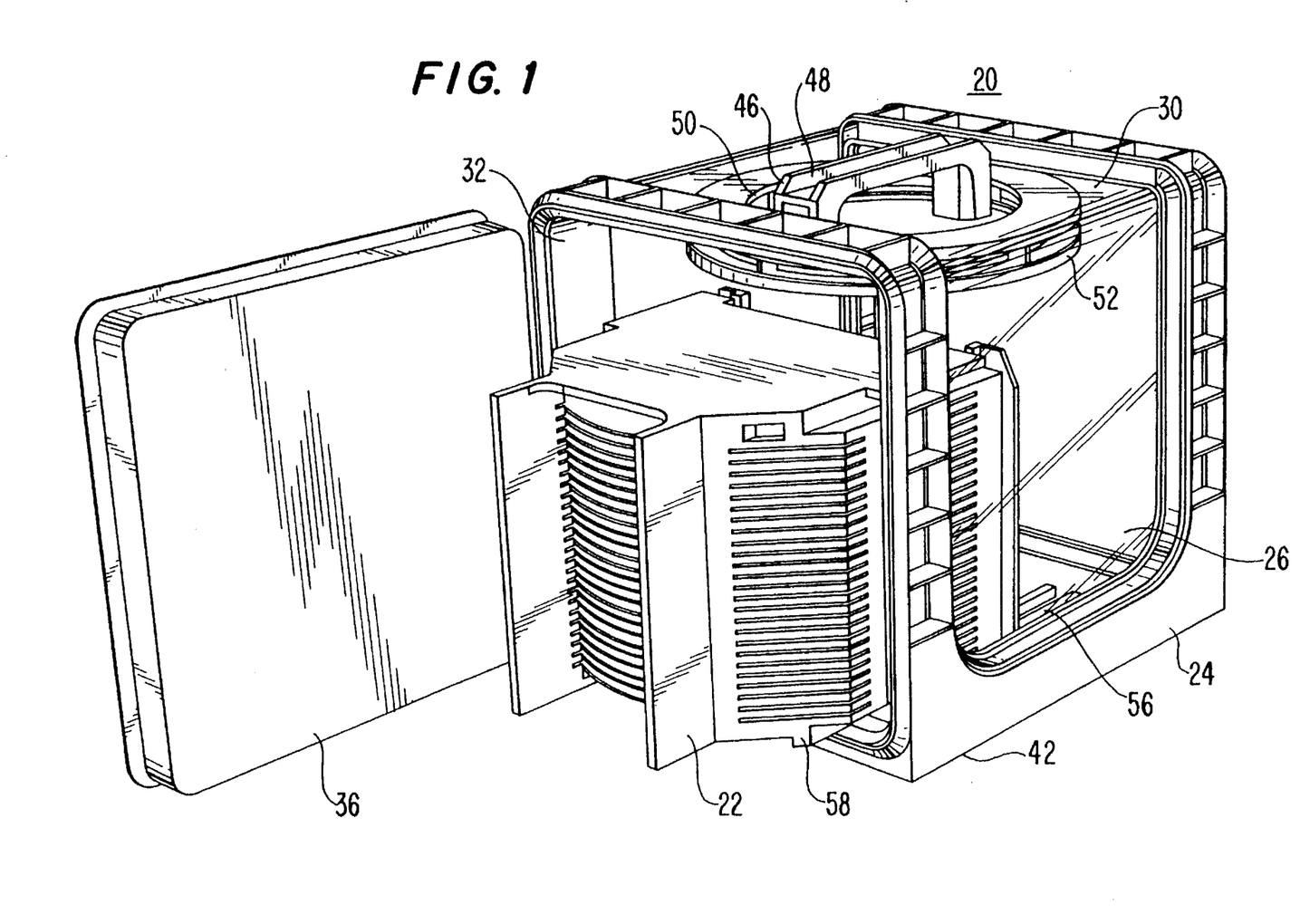
FIG. 1 is a perspective view of a three port container of the present invention, shown with a first side door in the open position.
Figure 2:
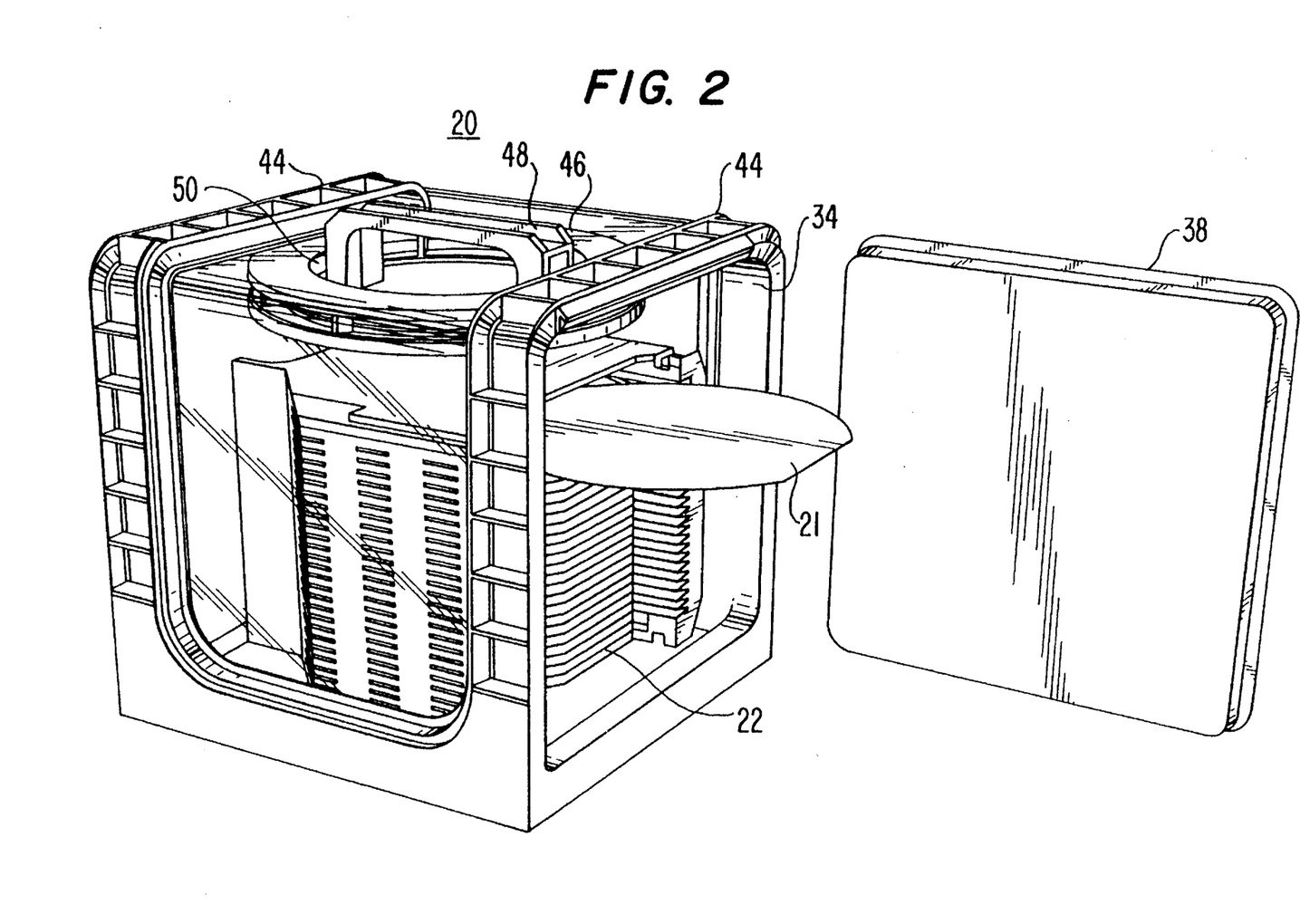
FIG. 2 is a perspective view of the three port container of FIG. 1, shown with a second side door in its open position.
Figure 3:
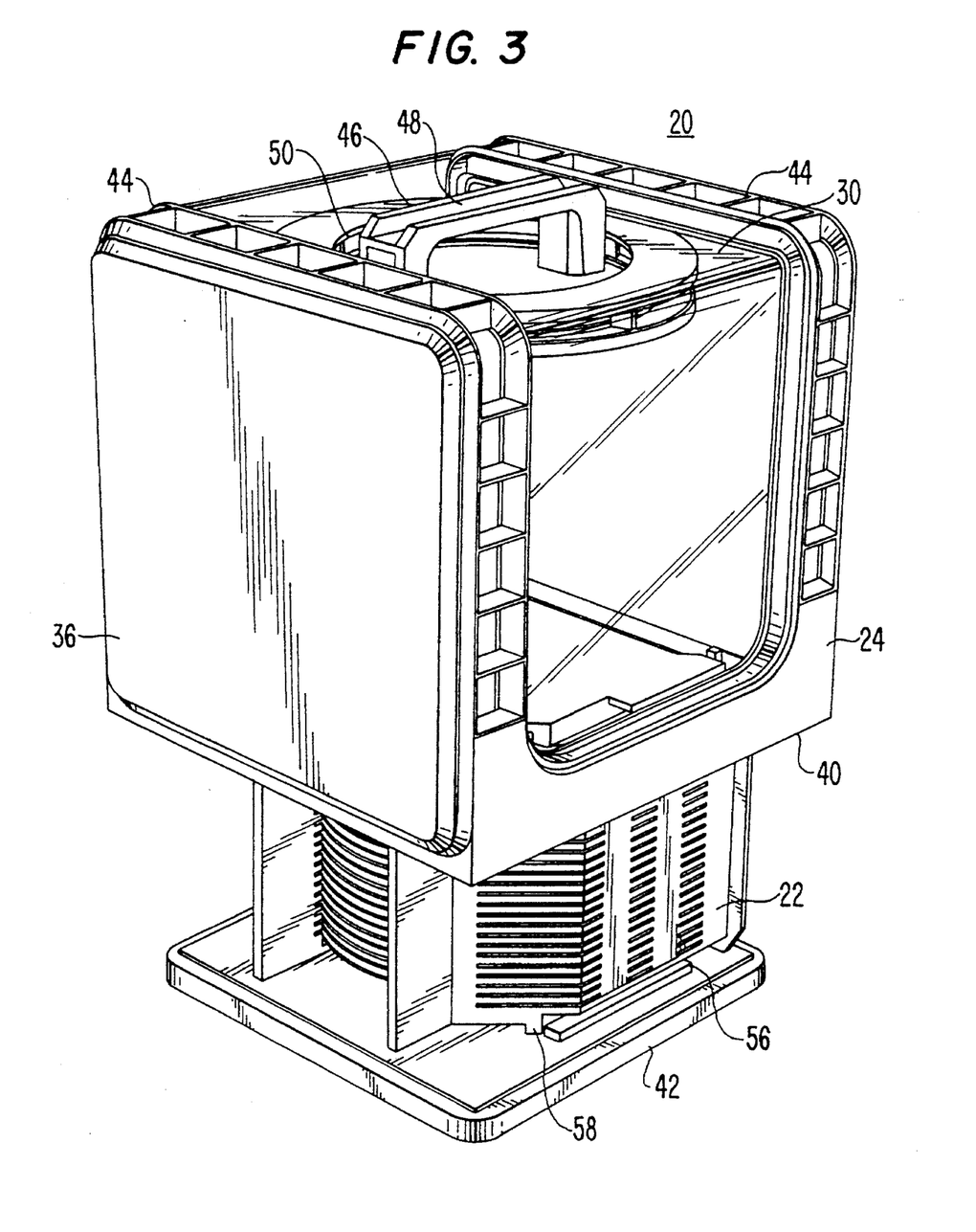
FIG. 3 is a perspective view of the three port container of FIG. 1, shown with its lower door in its open position.

Reference is now made to FIGS. 1, 2 and 3 which illustrate a three port embodiment of the present invention.

A clean air container 20 (pod) for transporting high purity items such as semiconductor wafers 21 stacked in a cassette 22 is shown. Container 20 comprises a housing 24 having sides 26 and 28, and a top 30. First and second side openings (ports) 32 and 34 are sealed by first and second removable side doors 36 and 38, respectively. A lower opening 40 is sealed by a lower or bottom door 42. "Sealed," as used herein, refers to closing of an opening or mating of surfaces to make a closing, and includes non-airtight as well as airtight closures.

The housing 24 can be molded from any suitable material such as a clear polymer material as shown. A polycarbonate material having static dissipative characteristics can be used where it is desired to prevent static charge buildup which can affect the wafers within the container 20.

Located on the top 30 is a handle 46 having a handle slot 48. The top of handle 46 is slightly higher than the container top 30. The slot 48 can thereby engage a complementary molded structure on the bottom of another container 20, providing added stability when several containers 20 are stacked one on top of the other.

A vent 50 permits air movement between the interior and exterior of pod 20 during changes in ambient pressure conditions. The vent 50 has a filter within a radial filter housing 52. The filter is preferably made of expanded polytetrafluoroethylene (PTFE) membrane as sold under the trademark GORE-TEX®, available from W. L. Gore & Associates, Inc. of Elkton, Md. Additionally, other filter material may be suitable.

Molded into the interior surface 54 of the bottom door 42 is a nest support 56 into which an H bar 58 of the cassette 22 sets to hold the cassette 22 in place. The bottom door 42 may be made in accordance with presently known SMIF systems, such as the semi-standard, to interface with bottom loading systems. Possible suitable bottom loading systems include those disclosed in U.S. Pat. No. 4,709,834 by Mortensen et al., U.S. Pat. No. 4,815,912 by Maney et al., and U.S. Pat. No. 4,963,069 by Wurst et al., the disclosures of which are hereby incorporated by reference.

Figure 4:
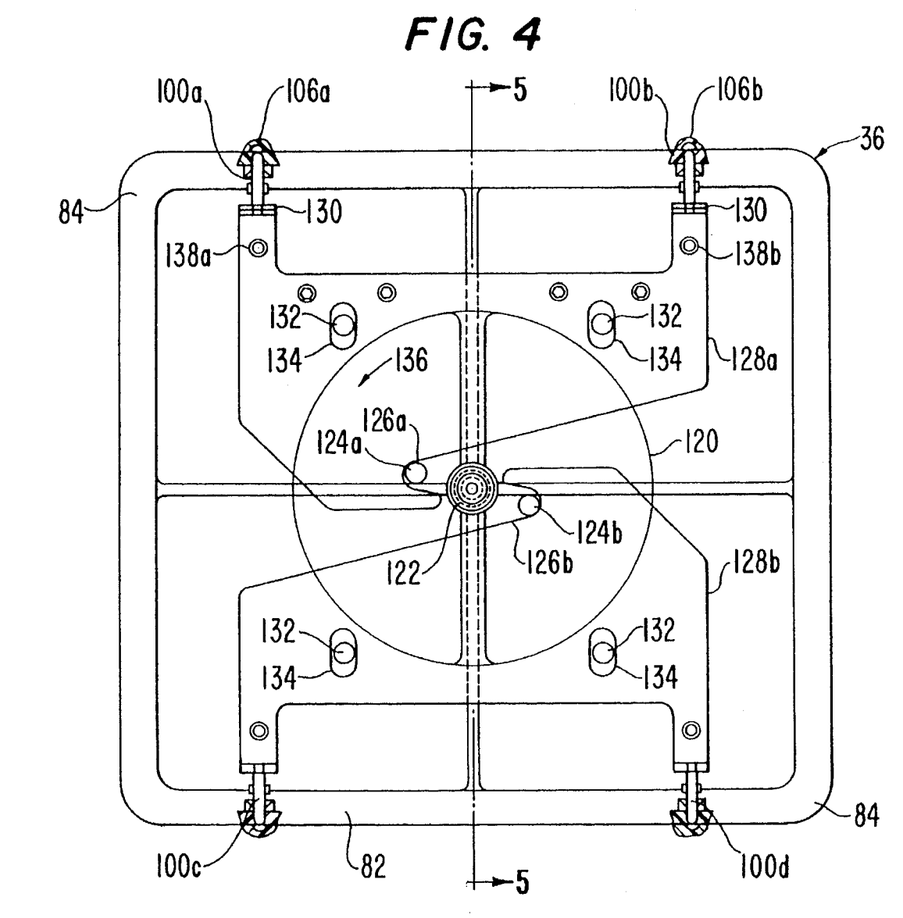
FIG. 4 is an elevational view of a side door of the present invention.
Figure 5:
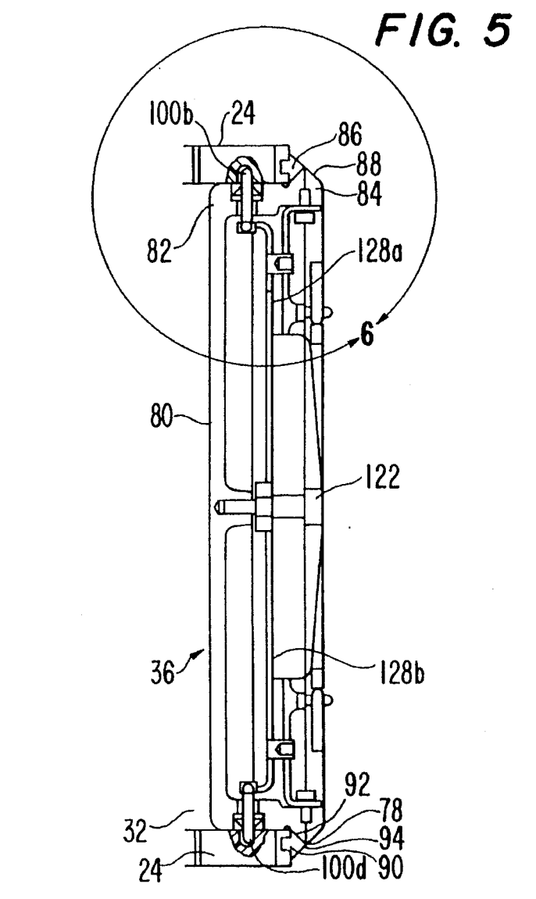
FIG. 5 is a sectional view along line 5—5 of FIG. 4.

Referring to FIGS. 4 and 5, a preferred side door and seal assembly for tightly closing and sealing the side openings is now described. Though one particular side door and opening is illustrated, it is understood that the description to follow may be applicable to any number of doors on the pod.

The door 36 seals opening 32 by way of the diagonal interface 78 having complementary seal segments which includes a first diagonal segment 84 on the door 36 seating against a second complementary segment 90 on the housing 24. The door 36 comprises an inside wall 80 having a flange 82 along the entire outer perimeter. Formed along the outside edge of the flange 82 is the diagonal seat segment 84 having an inner diagonal face 86 and an outer diagonal face 88. As shown, door wall 80, flange 82, and diagonal seat segment 84 form a single unit providing a solid door for completely sealing side opening 32. This single unit can be molded from the same material as the housing, such as polycarbonate, to provide a rigid, solid door.

Fixed to housing 24 along the outside perimeter of the side opening 32 is the complementary housing seal segment 90 having an inner diagonal face 92 and an outer diagonal face 94. The housing segment 90 is preferably made of a suitable continuous compressible material such as a compressible fluoro-elastomer. The inner face 92 of housing segment 90 is shaped to seal or seat against the inner face 86 of door segment 84, thereby forming a tight compressible seal against the more rigid seat face 84 when the door 36 is closed as shown, and readily separating from each other when the door is opened.

Figure 6:
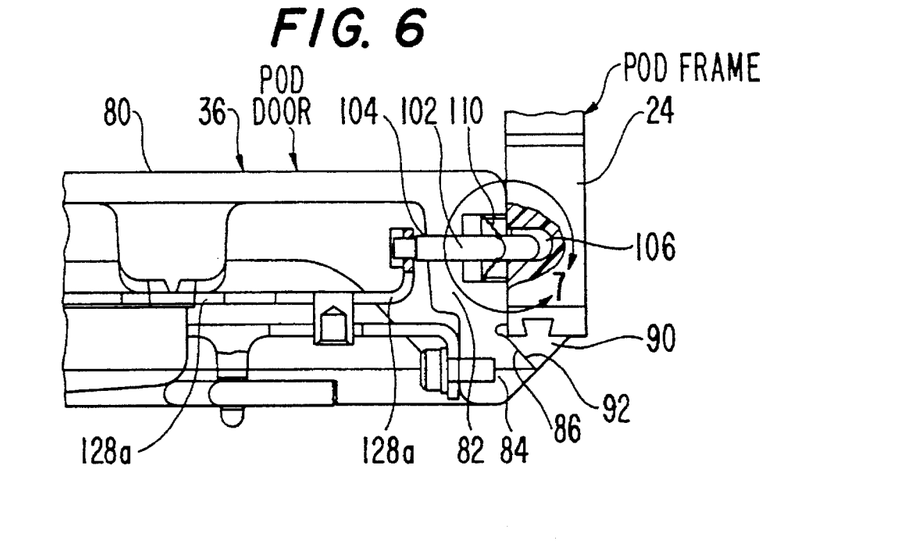
FIG. 6 is an enlarged sectional view of the latch mechanism of FIG. 5.
Figure 7:
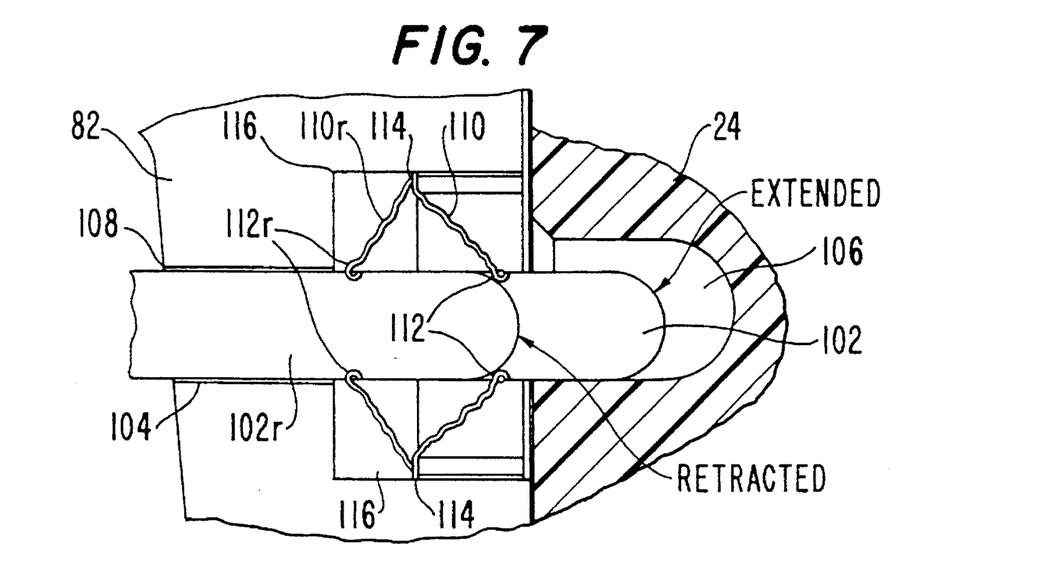
FIG. 7 is a fragmentary sectional view of the latch shown in FIG. 6 illustrating the latch sealing means.

Securing the side door 36 to housing 24 are latch assemblies 100a, 100b, 100c, 100d. As more clearly illustrated in FIGS. 6 and 7, showing latch assembly 100b in detail, each latch assembly has a pin 102 slidably housed within pin opening 104 in flange 82. The pin 102 sets into a complementary bore hole 106 formed in the housing 24 to securely hold the door 36 against the housing. Because the pin opening 104 is exposed to unclean outside air at the opening entrance 108, a flexible clean circular seal 110 is fixed along its inner circumference 112 to the pin 102, and along its outer circumference 114 to the inside bore wall 116 of the pin opening 104. The circular seal 110 prevents particles from passing through the pin opening 104 to the inside surface of the housing 24 which is part of the clean air environment when door 36 is removed. The seal 110 can be made of any suitable flexible clear membrane material such as that sold under the trademark GORE-TEX®. It is thus seen that the four latch assemblies 100a, 100b, 100c, 100d tightly secure door 36 to housing 24. Illustrated in FIG. 7 are the retracted positions of the pin 102r, the circular seal 110r, and the inner circumference of the circular seal 112r.

The mechanism for operating the latch assemblies is now described. As illustrated in FIGS. 4 and 5, a circular handle 120 is rotatably attached to the door wall 80 by a shaft 122. Attached to the back side of handle 120 are cylindrical arms 124a, 124b slidably engaging curved edges 126a, 126b of aluminum plates 128a, 128b. Aluminum plate 128a is fixed to the pin of latch assemblies 100a, 100b at joint 130; aluminum plate 128b is similarly fixed to the pin of latch assemblies 100c, 100d. Guide pins 132, fixed to the outside of door wall 80 and engagably sliding within aluminum plate guide slots 134, guide the vertical movement of the aluminum plates. It is seen that counter clockwise rotation 136 of the handle 120 moves the arm 124a in the same direction, thereby moving the aluminum plate 128a downward which in turn retracts the pins in latch assemblies 100a, 100b from the bore holes 106a, 106b. Latch assemblies 100c, 100d are retracted in a likewise manner. Counterclockwise rotation of handle 120 thereby unlatches the door from the housing 24.

A biasing spring (not shown) or other suitable mechanism urges the latch assemblies to an extended position (clockwise rotation of handle 120). To reseal, the door 36 is pushed into container opening 32 whereby pin 102 re-extends into bore 106.

A means is also provided for operating the latch assemblies without having to rotate handle 120. Referring to FIG. 4, the apertures 138a, 138b formed in aluminum plates 128a, 128b respectively are engageable by complementary pins (not shown) of a mechanism for moving plates 128a, 128b as required to operate the latches. Such a device permits operation of the latch assemblies where personnel cannot rotate the handle 120, such as when container 20 is interfaced with a clean environment.

Figure 8:
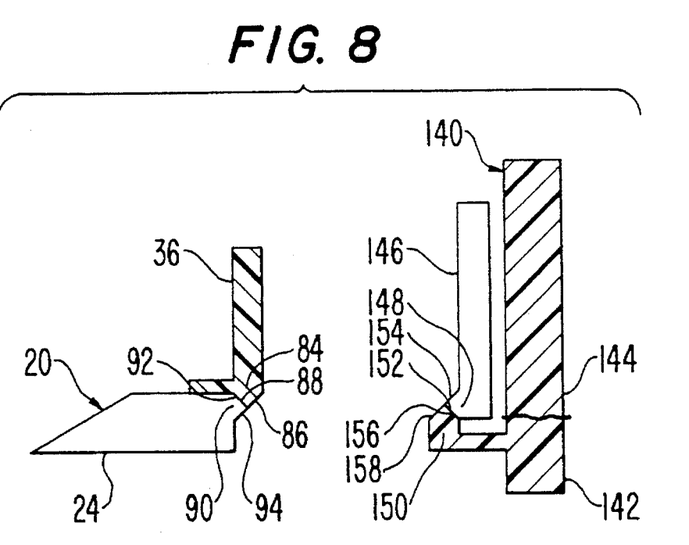
FIG. 8 is a fragmentary view illustrating the seal detail.
Figure 9:
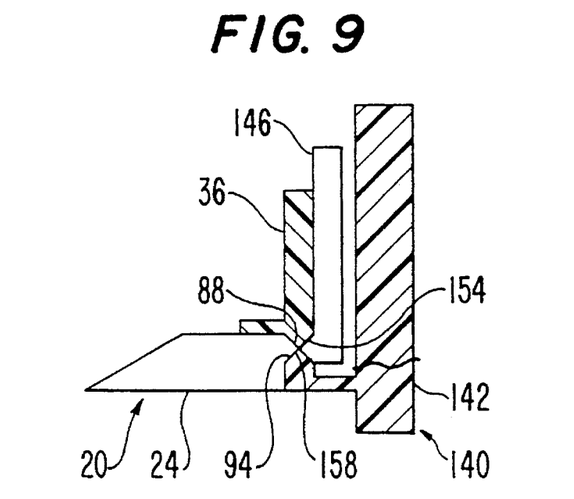
FIG. 9 is a view similar to FIG. 8 with the seals engaged.
Figure 10:
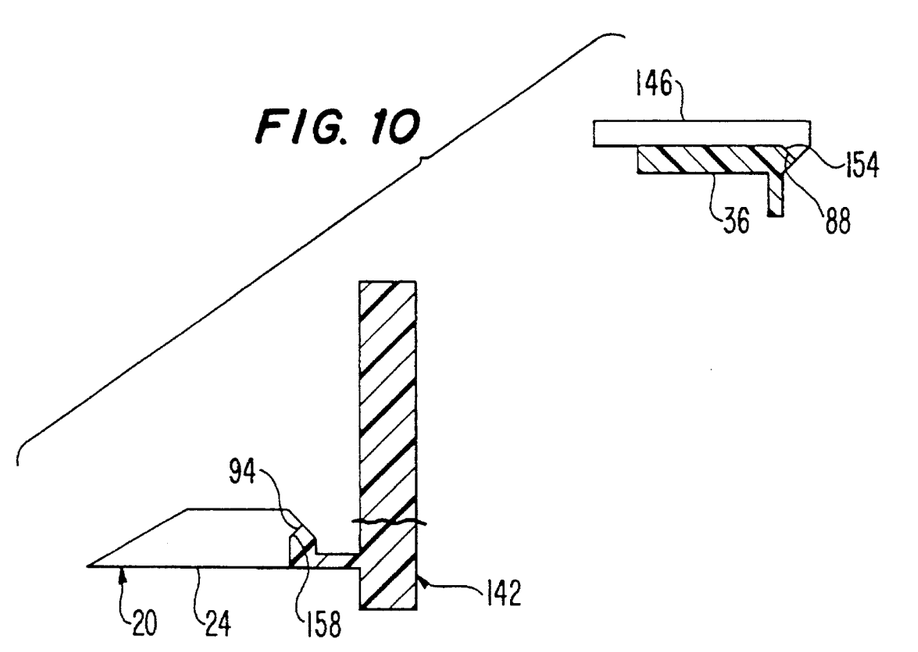
FIG. 10 is a view similar to FIG. 9 with the seals engaged and the container door removed.

Illustrated in FIGS. 8, 9, and 10 is the method of interfacing container 20 with a clean environment 140. FIG. 8, as similarly shown in FIG. 5, shows the container 20 having the side door 36 sealing the opening 32 in housing 24 (i.e., door seal surface 84 has faces 86 and 88, housing seal surface 90 has faces 92 and 94). The door face 86 seats against housing face 92, while door face 88 and housing face 94 are exposed to the outside environment.

Clean environment 140 has an interface port having an interface frame 142, an interface opening 144 in the frame 142 permitting access into the clean environment 140, and an interface door 146 sealing the interface opening 144. Interface door 146 seals interface opening 144 by way of complementary diagonal surfaces similarly described above for container 20. A diagonal seal surface 148 along the outer perimeter of the interface door has complementary faces 152 and 154 preferably made of a compressible material such as the material described for seal 90. A complementary seal surface 150 fixed to the interface frame along the perimeter of the interface opening has faces 156 and 158 and is made of a suitable material, such as polycarbonate polymer. The interface door face 152 seats against interface frame face 156, while interface door face 154 and interface frame face 158 are exposed to the outside environment.

Referring to FIG. 9, the container 20 initially interfaces with clean environment 140 by sealing the complementary seal faces on the two. The more flexible housing face 94 and the interface frame face 158, both previously exposed to the outside environment, are now tightly seated against each other, trapping any particles on the two faces 94 and 158 between them. Likewise, container door 36 mates with interface door 146 whereby container door face 88 and the more flexible interface door face 154 seat against each other, trapping any particles along the faces and on the exterior door walls.

Referring to FIG. 10, the mated doors of the container 36 and interface 146 are shown removed into the clean environment 140, providing an opening for transferring a cassette of wafers between the container 20 and the clean environment 140. The housing 24 is completely sealed to the clean environment around the entire opening between the two preventing contamination from the outside environment. To break the interface while preserving the cleanliness inside the container 20 and the clean environment 140, the mating process is reversed.

As demonstrated, the complementary diagonal seal surfaces provide an extremely clean interface system for sealing any container door to the container housing as well as for interfacing the container with a clean environment. The seal surfaces that at some point are exposed to unclean outside air never come in contact with the internal contamination free environment. Moreover, the mating seal surfaces meet head on without sliding or rubbing against each other when the seal is made. This reduces the particles generated by the seal process itself which normally occurs when seal surfaces are rubbed against each other.

Another important aspect of the present invention is that the latch assemblies are located on the container in-board of the seal faces to provide a continuous seal interface. This allows all four seal faces of the box and clean environment to meet at a single point without interference from the latches. This construction minimizes the area which can be exposed to contamination.

Figure 11:
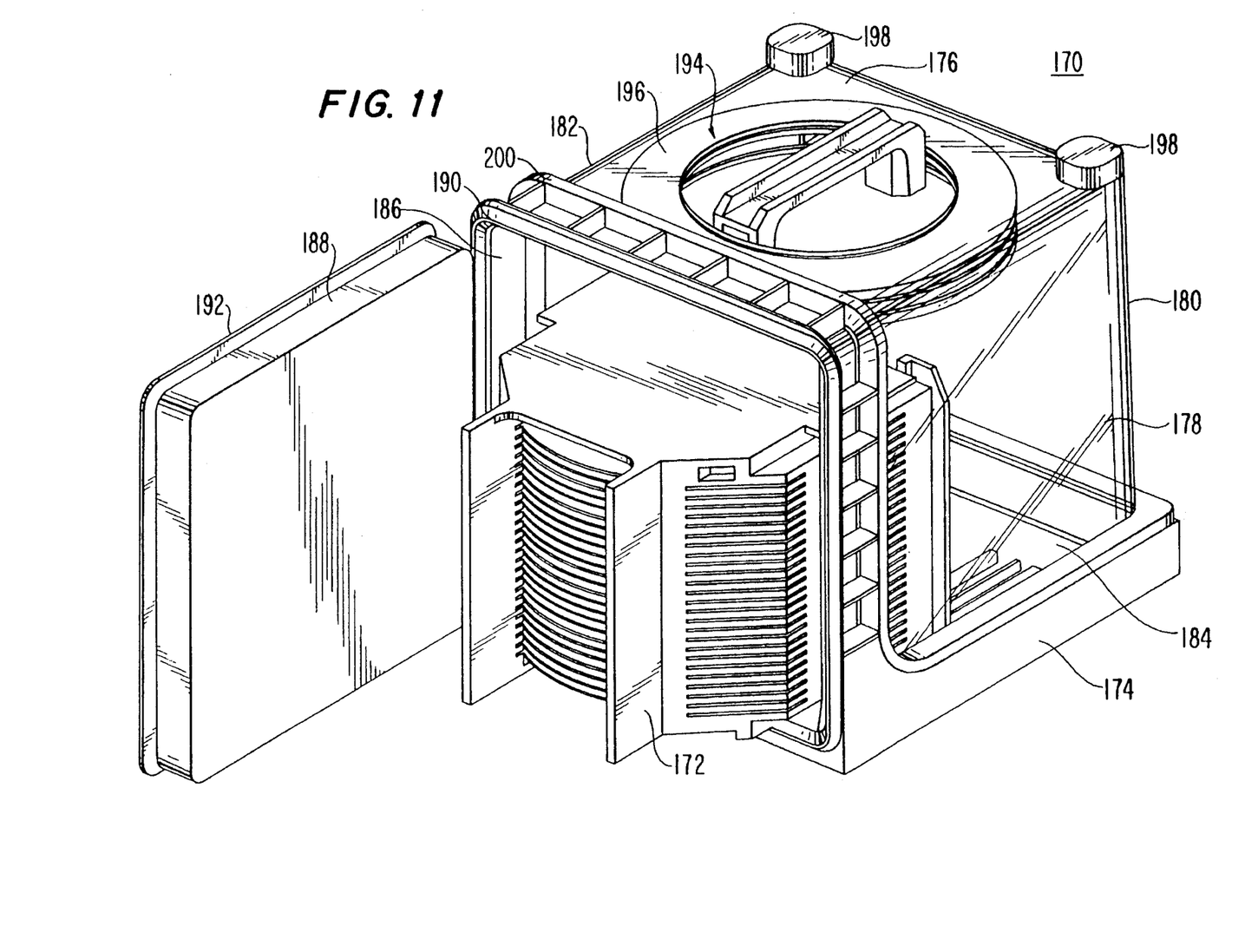
FIG. 11 is a perspective view of a two port container, another embodiment of the present invention.

A two door embodiment of the present invention is illustrated in FIG. 11. The container 170 for carrying a cassette 172 has a housing 174 having a top 176, three sides 178, 180, 182, a lower opening (not shown) sealable by a lower door 184, and a side opening 186 sealable by a side door 188. The lower door is adapted to interface with a clean environment, such as those in accordance with presently known SMIF systems. The side door 188 seals to the housing 174 by way of a diagonal interface comprising a door segment 190 and a complementary housing segment 192, both of which are adapted to interface with a clean environment as previously described herein.

On the top of the container 170 is a vent 194 comprising a radial filter housing 196 having a filter therein for allowing air flow between the interior and exterior of the container while maintaining a clean environment within the container. Arms 198 and the top of structural ribs 200 support another container 170 stacked on top.

The advantages of a container having more than one sealable opening capable of interfacing with a clean environment are readily seen. A manufacturer is no longer limited to just one interface system. With the present invention, clean environments having a second type of interface can be incorporated with existing equipment, allowing a gradual switch over to the newer system rather than a total retooling. For example, a manufacturer desiring to incorporate the cleaner side interface system disclosed herein can change over its existing manufacturing line one piece of equipment at a time, transporting the wafers between the two different systems with a container having two interface doors, one for each system. Moreover, it is seen that a third or fourth interface system can be incorporated into a manufacturing line by use of a three or four port container. It is also recognized that any face of the container can have an opening for interfacing with a clean environment, including the top of the container.

The advantages of a side interface port over the present bottom interface port are also apparent. Rather than lifting the container to the top of a clean environment so that the cassette can be lowered from the container bottom, personnel can operate the side interface door from more conducive heights. Another advantage, as illustrated in FIG. 2, is the ability to access wafers without removing the cassette from the container, such as by a pick and place robot which can remove each individual wafer one by one directly from the cassette.

While particular embodiments of the present invention are described herein, it is not intended to limit the invention to such disclosure and changes and modifications may be incorporated and embodied within the scope of the appended claims.

The invention claimed is:

1. A container for transporting high purity items to and from a clean environment comprising:

a housing having an interior and an exterior surface, and including therein at least two openings, a lower opening and a side opening;

a lower door unit sealing said lower opening of said housing and adapted to interface with a first access port on the clean environment; and a side door unit sealing said side opening of the housing and adapted to interface with a second access port on the clean environment, wherein said housing includes at least one additional side opening; and an additional side door seals said additional side opening and is adapted to interface with a vertical access port on the clean environment.

2. A clean environment container for semiconductor wafers comprising;

a housing defining an interior space for containing the wafers;

a plurality of container openings in said housing wherethrough the wafers can be transferred; and container doors for sealing said container openings, said container doors adapted to interface with an access door on a clean environment, wherein one of said container openings is on the bottom of said housing, a second container opening is on the side of said housing, and a third opening is on the opposing side of said housing from said second opening.

3. A container for interfacing with clean environment comprising;

a housing having an interior and an exterior surface and an opening therein;

a container door adapted to seal said opening;

a first seal area on said housing adapted to seal against a complementary second seal area on the container door, and further adapted to seal against a complementary third seal area on the clean environment when the container interfaces with the clean environment, and wherein said second seal area of each said container door is further adapted to seat against a complementary fourth seal area on a clean environment access door when the container interfaces with the clean environment, wherein said first seal area of said housing comprises first and second housing faces;

said second seal area of each said container door comprises first and second container door faces;

said first housing face seats against said first container door face when said door seals said opening;

said second housing face is adapted to seat against said complementary third seal area on the clean environment when the container interfaces with the clean environment; and said second container door face is adapted to seat against said complementary fourth seal area on each clean environment access door when the container interfaces with the clean environment.

4. An interface seal for a container having a housing, an opening in the housing, and a door for closing the opening, said interface seal comprising:

a first diagonal seal segment on the door, said first segment adapted to seal against an access door on a clean environment;

a second diagonal seal segment on the housing, said second segment adapted to seal against a clean environment;

said first and second seal segments complement each other to form a seal against each other when the container door closes the container opening, and to separate from each other when the container door is opened;

wherein when the container door closes the container opening and the container is not attached to a clean environment, the first diagonal seal segment and the second diagonal seal segment are exposed to air surrounding the container; and wherein when the container is attached to the clean environment, the first diagonal seal segment tightly seals against a door on the clean environment and the second diagonal seal segment tightly seals against an exterior frame of the clean environment so that any particles on the two segments are trapped between them and the door and frame of the clean environment and said particles are not exposed to the clean environment.

* * * * *